United States Patent
Rice et al.

(10) Patent No.: US 8,049,957 B2
(45) Date of Patent: Nov. 1, 2011

(54) SCALABLE SEMICONDUCTOR WAVEGUIDE AMPLIFIER

(75) Inventors: Robert Rex Rice, Simi Valley, CA (US); Hagop Injeyan, Glendale, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 282 days.

(21) Appl. No.: 11/983,028

(22) Filed: Nov. 6, 2007

(65) Prior Publication Data

US 2009/0116805 A1  May 7, 2009

(51) Int. Cl.
  *H01S 5/00* (2006.01)
  *G02B 6/02* (2006.01)
(52) U.S. Cl. .................................. 359/344; 385/132
(58) Field of Classification Search .............. 359/344; 385/132
  See application file for complete search history.

(56) References Cited

U.S. PATENT DOCUMENTS

| | | | | |
|---|---|---|---|---|
| 4,953,170 | A | * | 8/1990 | Logan et al. ............ 372/44.01 |
| 5,105,430 | A | * | 4/1992 | Mundinger et al. ............ 372/35 |
| 5,640,474 | A | | 6/1997 | Tayag |
| 5,838,842 | A | | 11/1998 | Mackie |
| 5,852,691 | A | | 12/1998 | Mackie |
| 5,862,288 | A | | 1/1999 | Tayag et al. |
| 6,894,828 | B2 | | 5/2005 | Pelouch et al. |
| 7,042,631 | B2 | | 5/2006 | Smith et al. |
| 7,061,956 | B2 | | 6/2006 | Eitel |
| 7,068,420 | B2 | | 6/2006 | Tallone et al. |
| 7,068,905 | B2 | * | 6/2006 | Vakhshoori et al. ............ 385/129 |
| 7,106,774 | B2 | * | 9/2006 | Fisher ............ 372/46.01 |
| 7,169,629 | B2 | | 1/2007 | Wu et al. |
| 7,193,771 | B1 | | 3/2007 | Smith et al. |
| 7,228,020 | B2 | * | 6/2007 | Weigert ............ 385/14 |
| 2001/0043387 | A1 | | 11/2001 | Lawrence et al. |
| 2002/0051615 | A1 | | 5/2002 | Walpole et al. |
| 2003/0063884 | A1 | * | 4/2003 | Smith et al. ............ 385/129 |
| 2004/0008405 | A1 | | 1/2004 | Pelouch et al. |
| 2004/0042069 | A1 | * | 3/2004 | Fisher ............ 359/344 |

OTHER PUBLICATIONS

Baker et al, "Self-imaging and high-beam-quality operation in multi-mode planar waveguide optical amplifiers", Optics Express, vol. 10 No. 6, pp. 297-302 (Mar. 2002).*

* cited by examiner

*Primary Examiner* — Eric Bolda
(74) *Attorney, Agent, or Firm* — Carmen Patti Law Group, LLC

(57) ABSTRACT

One embodiment of the present method and apparatus encompasses an apparatus that may have: a predetermined length, the self-imaging semiconductor waveguide having first and second opposed sides; quantum wells disposed within the self-imaging semiconductor waveguide along the length of the self-imaging semiconductor waveguide, the quantum wells being formed of a quantum well gain material; microchannel cooler that extends substantially the width of the self-imaging semiconductor waveguide, the microchannel cooler located adjacent the first side of the self-imaging semiconductor waveguide; and a plurality of pump arrays arranged along the microchannel cooler opposed from the first side of the self-imaging semiconductor waveguide; wherein the quantum well gain material is photopumped through the microchannel cooler.

11 Claims, 14 Drawing Sheets

FIG. 6. Three-dimensional representation of the thermal resistivity for $In_{1-x}Ga_xAs_yP_{1-y}$ quaternary alloy over the entire range of compositions.

SCALABLE SEMICONDUCTOR WAVEGUIDE AMPLIFIER

TECHNICAL FIELD

The invention relates generally to waveguide amplifiers and, more particularly, to a scalable semiconductor waveguide amplifier.

BACKGROUND

Optical fiber technology is a core technology for long-distance communication systems. Recently, it has been also applied in short-distance communication systems such as interconnection between systems, or short-distance networks. This progress is achieved via the implementation of a vertical-cavity surface emitting laser (VCSEL). Compared with an edge-emitting laser, the size of the vertical-cavity surface emitting laser is reduced with less power consumption. The greatest benefit of VCSEL is its low fabrication cost. VCSEL can be tested on wafers so that any failed devices can be found before packaging to save the production cost.

Erbium doped optical amplifiers have been used for many years in optical telecommunications networks to boost the strength of an optical signal as it is transmitted along a fiber. While there are many different types of these amplifiers, they all typically rely on relatively expensive narrow-band lasers as the pumping sources. It has been recently shown that in some specially prepared erbium doped optical waveguides, such as silica layers containing Si nanocrystals or nanoclusters dispersed in the erbium doped glass matrix, that the erbium can be efficiently excited using light sources which emit over a broad wavelength range in the near-infrared or visible portion of the electromagnetic spectrum. Light emitting diodes (LEDs) have been used as a low cost pumping source for these types of amplifiers as there is no longer a strict requirement on the pumping wavelength as is the case in standard erbium doped glass. Such an arrangement has been discussed in a paper by Jinku Lee and Jung H. Shun entitled "Optical gain at 1.5 microns in nanocrystal Si sensitized erbium doped silica waveguide using top-pumping 470 nm LEDs" presented at the 2004 OFC meeting. Here an array of LEDs was used to pump a section of erbium doped silica waveguide, which had been sensitized with Si nanocrystals.

However, as in the case above, the much lower radiance of the LED, compared to a laser, places a limitation on the efficiency in which the pump power can be transferred to the active medium of the waveguide and consequently on the output power of the amplifier. Thus for a given length of fiber in a communications network, more LED based amplifiers would be required thereby negating any cost savings over laser based amplifiers.

In general, the prior art taught self-imaging waveguide amplifiers, photopumped VCSELS and Semiconductor Coupled Optical Waveguide Lasers (SCOWL). However, none of the prior art provide, for a optically-pumped, semiconductor waveguide amplifier, high power with diffraction limited beams and very high efficiency over a wide range of wavelength.

SUMMARY

One embodiment of the present method and apparatus encompasses an apparatus. The apparatus may comprise: a photopumped self-imaging multimode waveguide amplifier using a semiconductor gain media; and a plurality of pump arrays arranged along the self-imaging multimode waveguide.

Another embodiment of the present method and apparatus encompasses an apparatus. This apparatus may comprise: a self-imaging semiconductor waveguide having a predetermined length, the self-imaging semiconductor waveguide having first and second opposed sides; quantum wells disposed within the self-imaging semiconductor waveguide along the length of the self-imaging semiconductor waveguide, the quantum wells being formed of a quantum well gain material; microchannel cooler that extends substantially the width of the self-imaging semiconductor waveguide, the microchannel cooler located adjacent the first side of the self-imaging semiconductor waveguide; and a plurality of optical pump arrays arranged along the second side opposed from the first side of the self-imaging semiconductor waveguide; wherein the quantum well gain material is photopumped by the pump arrays.

A further embodiment of the present method and apparatus encompasses an apparatus. This apparatus may comprise: a self-imaging semiconductor waveguide having a predetermined length, the self-imaging semiconductor waveguide having first and second opposed sides; quantum wells disposed within the self-imaging semiconductor waveguide along the length of the self-imaging semiconductor waveguide; first and second heat sinks that extend substantially the width of the self-imaging semiconductor waveguide, the first heat sink located adjacent the first side of the self-imaging semiconductor waveguide and the second heat sink located adjacent the second side of the self-imaging semiconductor waveguide; and a first plurality of pump arrays arranged along the first heat sink opposed from the first side of the self-imaging semiconductor waveguide, and a second plurality of pump arrays arranged along the second heat sink opposed from the second side of the self-imaging semiconductor waveguide.

DESCRIPTION OF THE DRAWINGS

The features of the embodiments of the present method and apparatus are set forth with particularity in the appended claims. These embodiments may best be understood by reference to the following description taken in conjunction with the accompanying drawings, in the several figures of which like reference numerals identify like elements, and in which:

DETAILED DESCRIPTION

Embodiments of the present method and apparatus achieve high power with diffraction limited beams and very high efficiency over a wide range of wavelengths. These embodiments provide systems that combine the wavelength flexibility of semiconductor lasers with the high power and efficiency heretofore only available with solid state lasers at fixed wavelengths.

Embodiments of the present method and apparatus provide a scalable semiconductor waveguide amplifier that is a photopumped self-imaging multimode waveguide amplifier using a semiconductor gain media. It may be fabricated by standard epitaxial crystal growth, which is simpler than VCSEL growth. In these embodiments the photopumping of embedded quantum wells avoids electrical injection. There is a very low quantum defect with resonant pumping, and low optical loss for undoped semiconductor waveguide material. Wavelength may be set by composition and thickness of quantum wells. Depending on waveguide loss, optical to optical efficiency may easily exceed 80%.

The use of high thermal conductivity materials enables robust power scaling and self-imaging assures diffraction limited output beam.

Face-pumping occurs directly or through transparent thermally conducting heat sinks such as SiC or diamond, (thermal conductivity of 3.5 and 22 W/cm-K respectively) which enables extremely efficient pump coupling with good thermal management. The wide band gap semiconductor waveguide material has high thermal conductivity (e.g., InP with 0.68 W/cm-K). Gain is adjusted by number of quantum wells and pumping level.

Although the depicted embodiments of the present method and apparatus are primarily continuous wave (CW), embodiments may also be pumped by pulsed lasers (e.g., Nd:YAG, Er:YAG, fiber lasers). A diode pumped module according to the present embodiments may be capable of roughly 5-10 kW.

Figure 1:
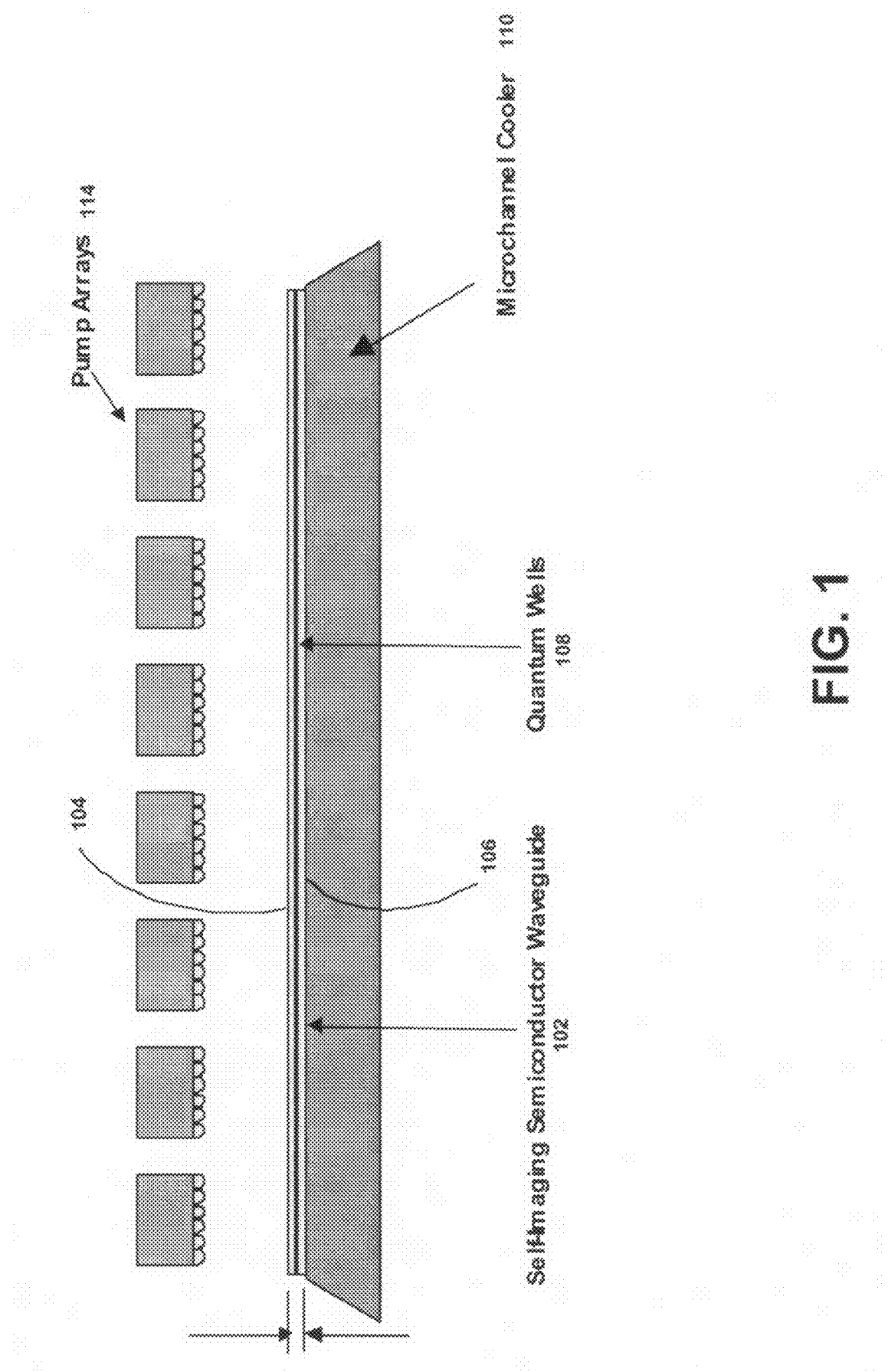
FIG. 1 depicts an embodiment according to the present method and apparatus of a photopumped semiconductor waveguide amplifier architecture.

FIG. 1 depicts an embodiment according to the present method and apparatus of a photopumped semiconductor waveguide amplifier architecture. This embodiment may be a semiconductor waveguide amplifier soldered to a microchannel cooler and pumped from the opposite side with a plurality of diode arrays (one sided pumping). Thus, the depicted embodiment may have a self-imaging semiconductor waveguide 102 having a predetermined length, the self-imaging semiconductor waveguide 102 having first and second opposed sides (faces) 104, 106. Quantum wells 108 may be disposed within the self-imaging semiconductor waveguide 102 along the length of the self-imaging semiconductor waveguide 102. A microchannel cooler 110 extends substantially the width of the self-imaging semiconductor waveguide 102, the microchannel cooler 110 located adjacent the first side 104 of the self-imaging semiconductor waveguide 102. The microchannel cooler 110 may be fabricated using highly conductive alloy materials such as Copper-Molybdenum, Copper-Tungsten or Copper diamond that are compositionally tuned such that their thermal expansion matches the semiconductor waveguide 102. A plurality 114 of pump arrays may be arranged along the microchannel cooler 110 opposed from the first side 104 of the self-imaging semiconductor waveguide 102.

Figure 2:
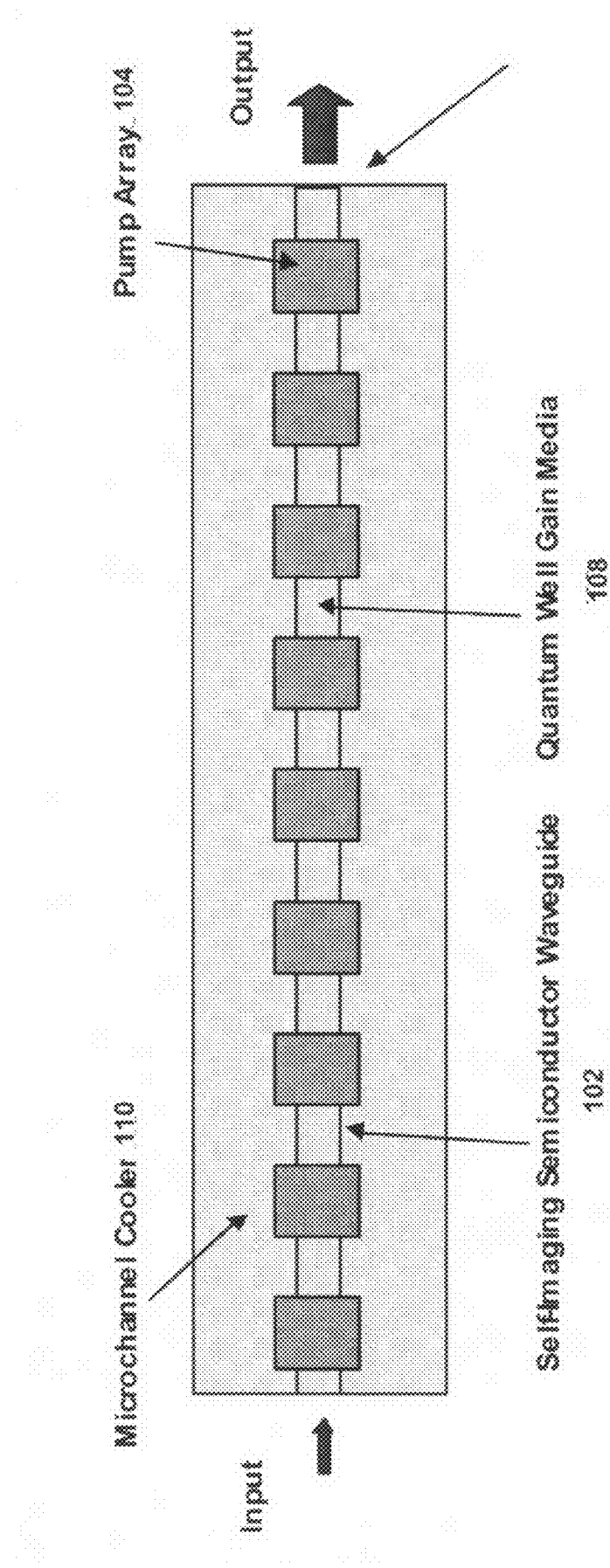
FIGS. 2 and 3 show top and end views of the FIG. 1 embodiment.
Figure 3:
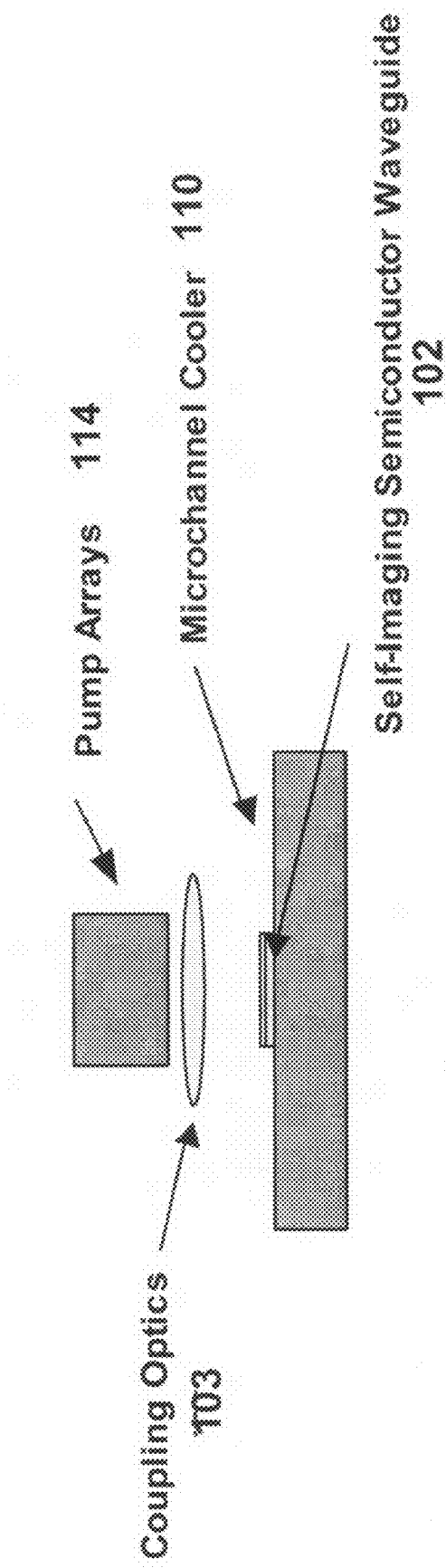

FIGS. 2 and 3 show top and end views of the FIG. 1 embodiment. FIG. 2 more clearly shows the microchannel cooler 110 extending substantially the width of the self-imaging semiconductor waveguide 102. Also, shown is the plurality 114 of pump arrays that may be arranged along the microchannel cooler 110. FIG. 3 also shows coupling optics 103 that may be located between the pump arrays 114 and the self-imaging semiconductor waveguide 102.

Figure 4:
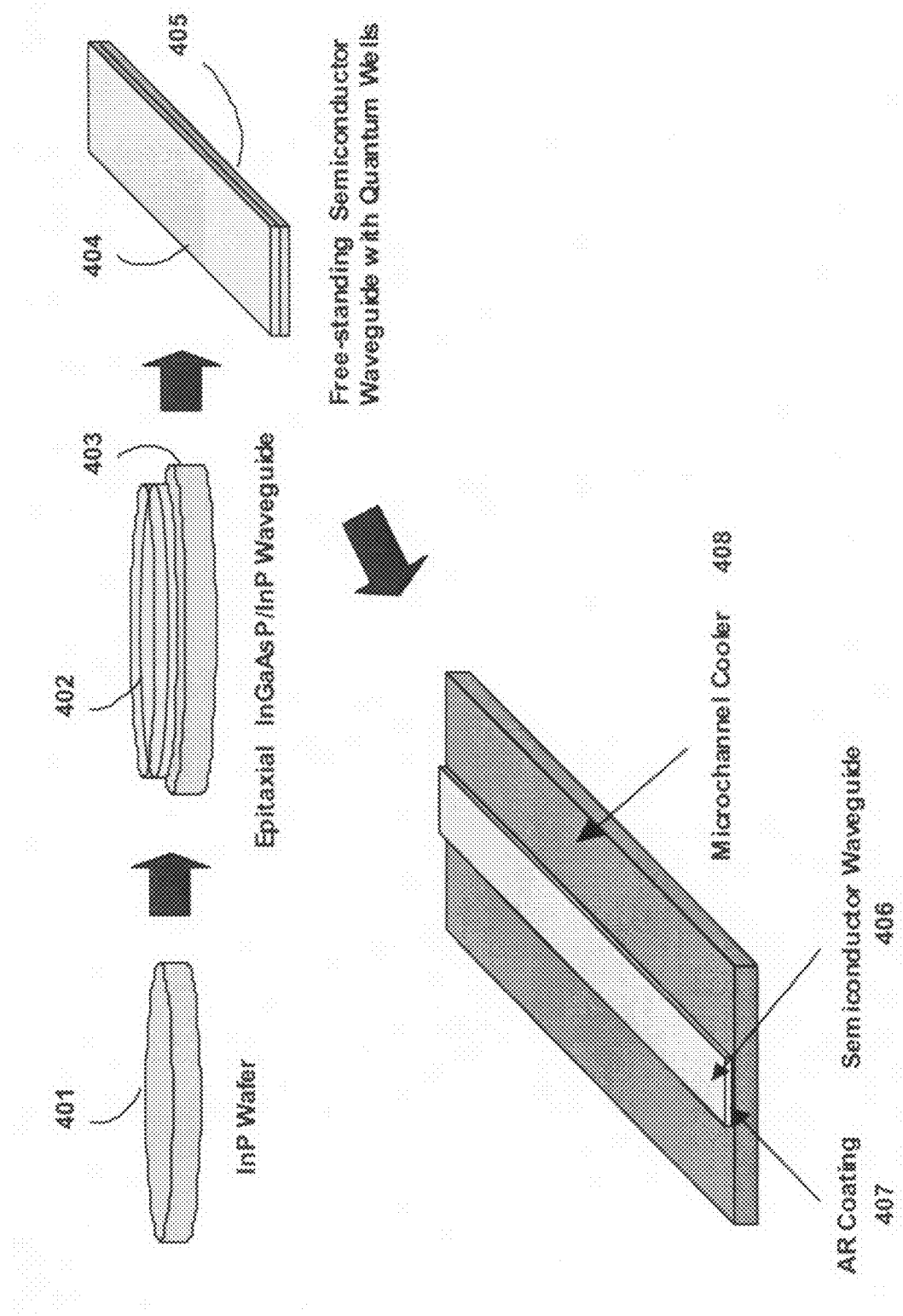
FIG. 4 depicts a semiconductor waveguide fabrication process for the alternative embodiment of FIG. 1 according to the present method and apparatus.
Figure 5:
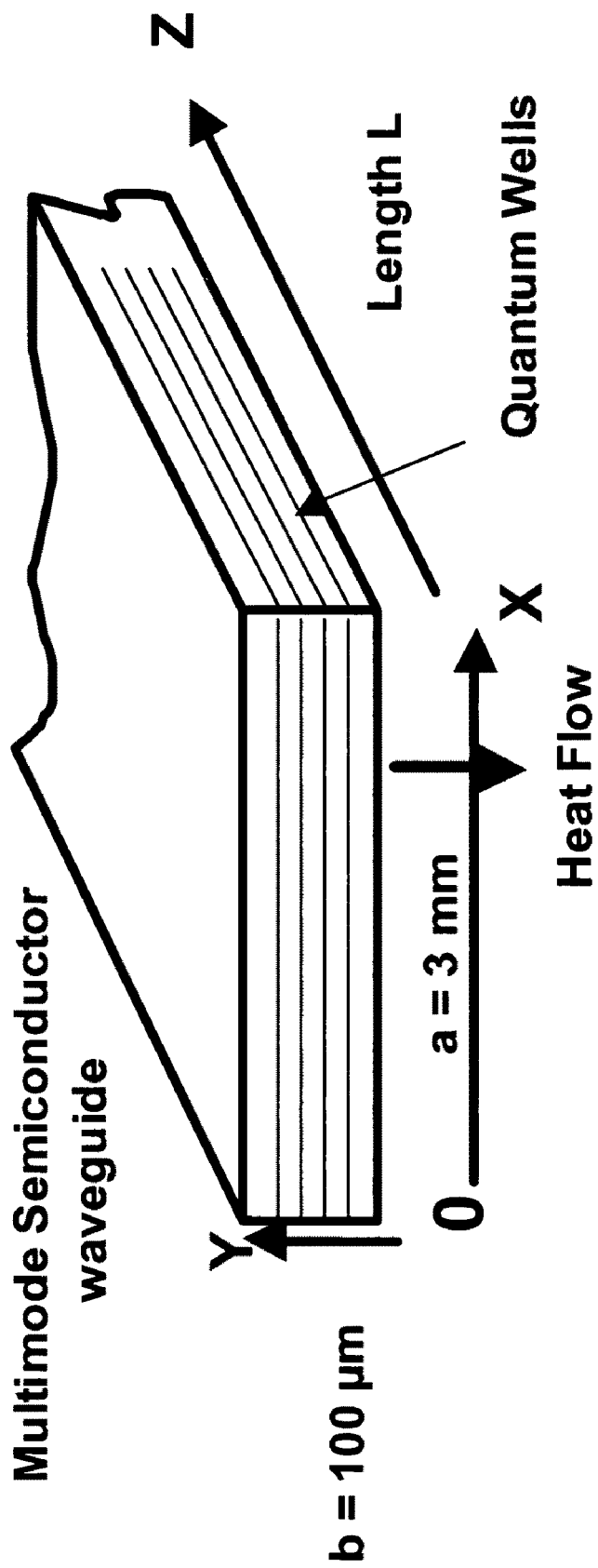
FIG. 5 depicts one example of a semiconductor waveguide amplifier model for the alternative embodiment of FIG. 1.

FIG. 4 depicts a semiconductor waveguide fabrication process according to the present method and apparatus. Fabrication and processing may be performed entirely with an InP or other semiconductor wafer 401. Epitaxial layers 402 may be grown on 3 or 4 inch substrates 403. Free-standing semiconductor waveguide 404 may have quantum wells 405 and may use quaternary alloys to control band gap and lattice constant. Also depicted is the waveguide 406, AR coating 207 and microchannel cooler 408.

Figure 6:
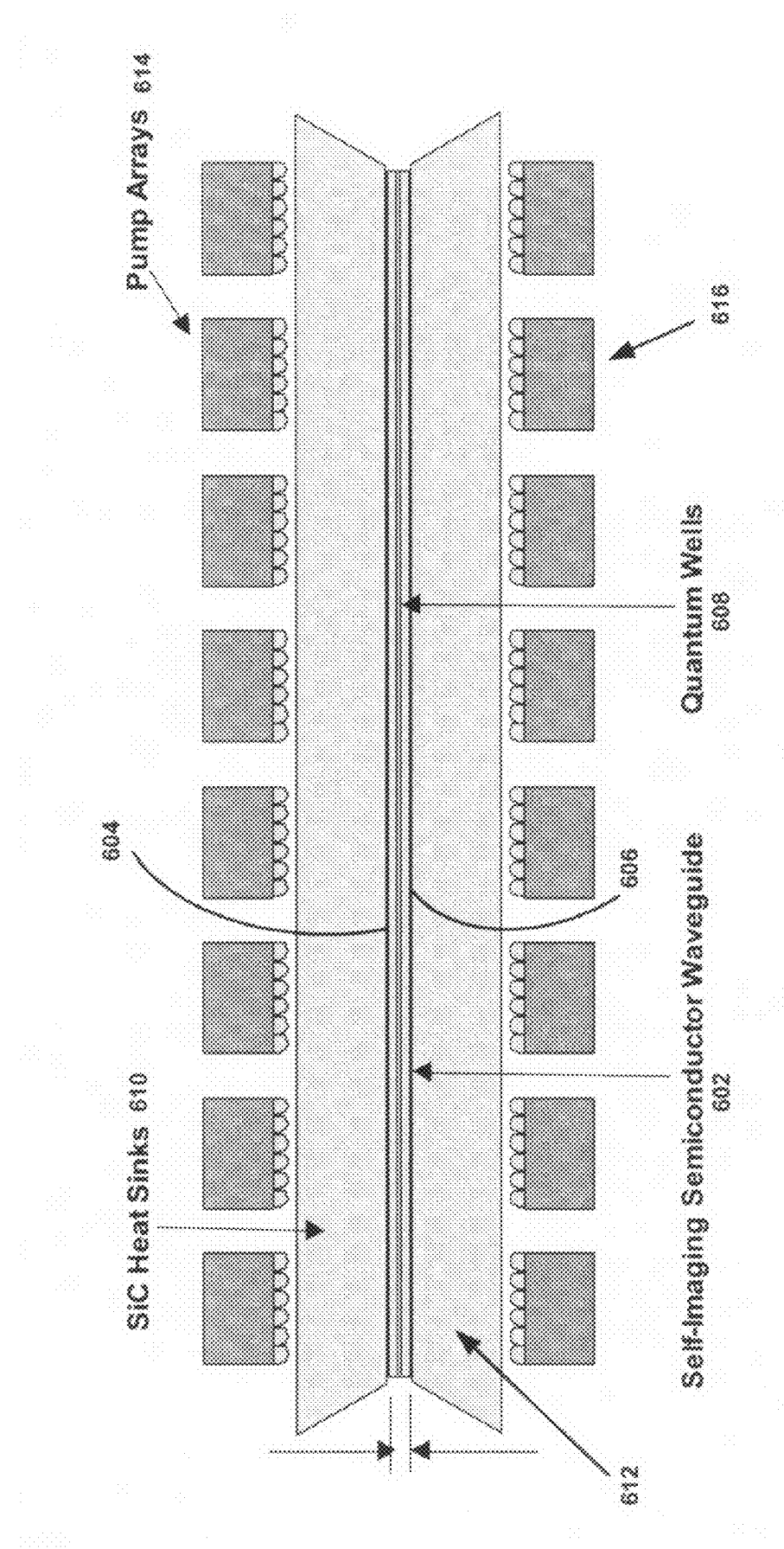
FIG. 6 depicts an alternative embodiment according to the present method and apparatus of a photopumped semiconductor waveguide amplifier architecture.

FIG. 6 depicts an alternative embodiment according to the present method and apparatus of a photopumped semiconductor waveguide amplifier architecture. The depicted embodiment may have a self-imaging semiconductor waveguide 602 having a predetermined length, the self-imaging semiconductor waveguide 602 having first and second opposed sides (faces) 604, 606. Quantum wells 608 may be disposed within the self-imaging semiconductor waveguide 602 along the length of the self-imaging semiconductor waveguide 602. First and second heat sinks 610, 612 extend substantially the width of the self-imaging semiconductor waveguide 602, the first heat sink 610 located adjacent the first side 604 of the self-imaging semiconductor waveguide 602 and the second heat sink 612 located adjacent the second side 606 of the self-imaging semiconductor waveguide 602. A first plurality 614 of pump arrays may be arranged along the first heat sink 610 opposed from the first side 604 of the self-imaging semiconductor waveguide 602, and a second plurality 616 of pump arrays may be arranged along the second heat sink 612 opposed from the second side 606 of the self-imaging semiconductor waveguide 602.

Figure 7:
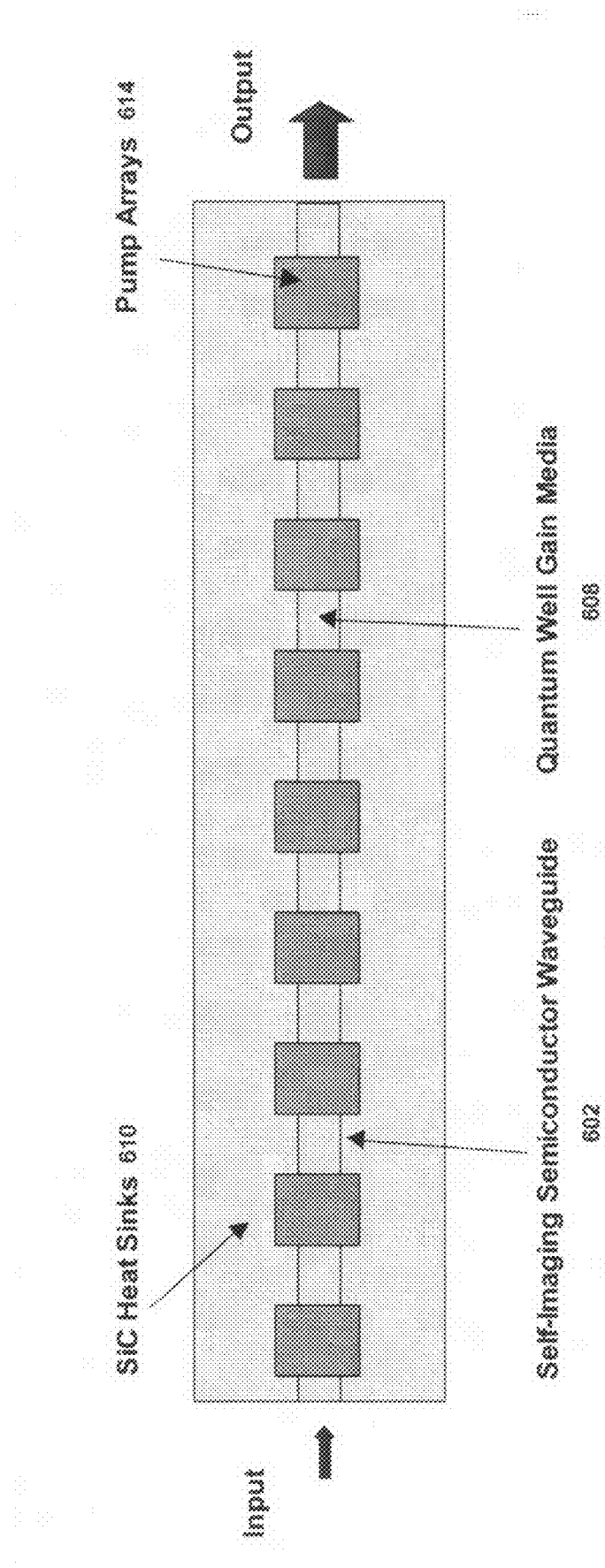
FIGS. 7 and 8 show top and end views of the FIG. 1 embodiment.
Figure 8:
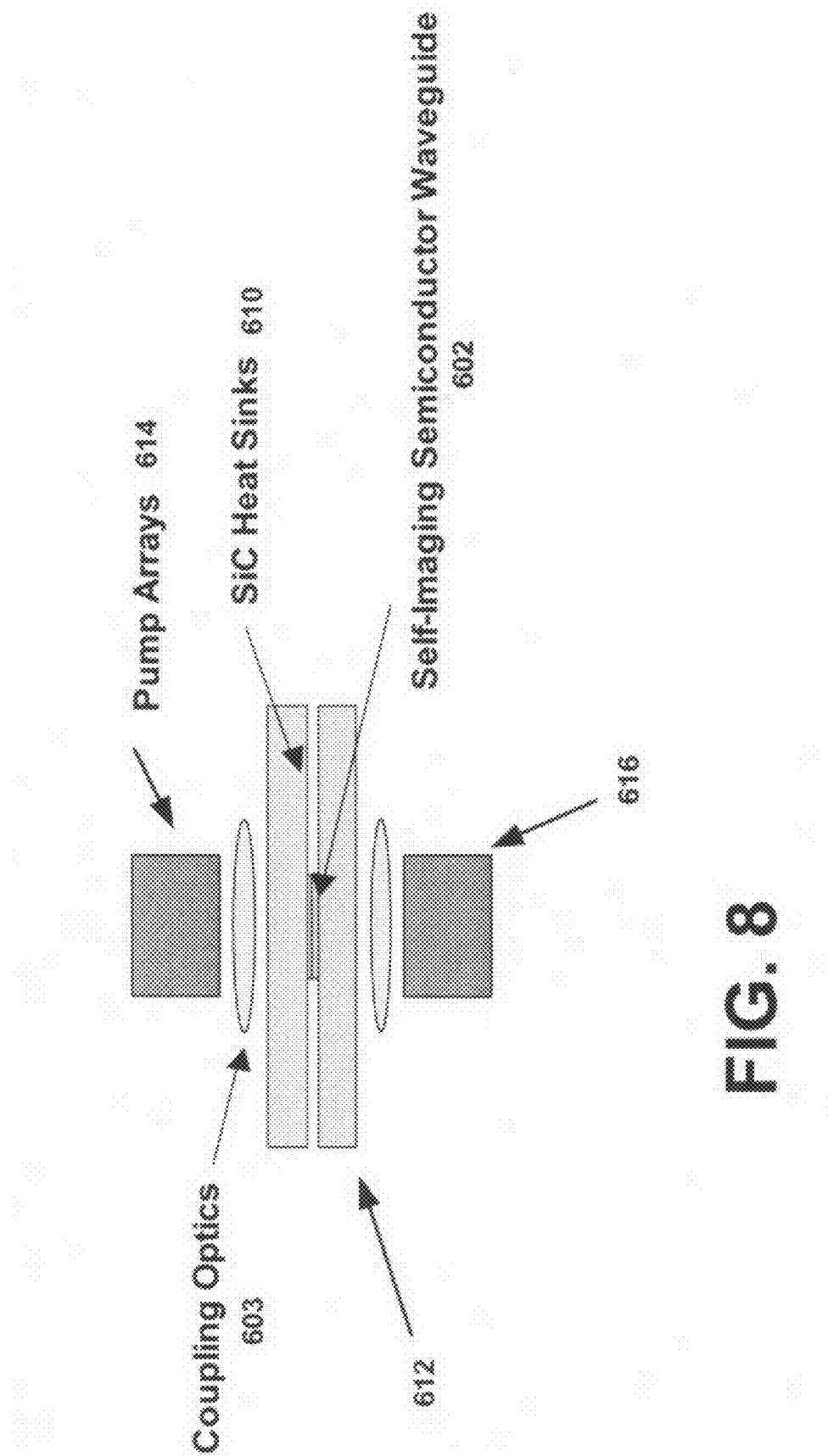

FIGS. 7 and 8 show top and end views of the FIG. 6 embodiment. FIG. 7 more clearly shows one of the SiC heat sinks 610, 616 extending substantially the width of the self-imaging semiconductor waveguide 602. Also, shown is one of the pluralities 614, 616 of pump arrays that may be arranged along respectively one of the heat sinks 610, 612. FIG. 8 also shows coupling optics 603, 605 that may be located between the respective pump arrays 614, 616 and respective heat sinks 610, 612. The semiconductor self-imaging multimode waveguide slab amplifier provides revolutionary solid state laser capability. The high thermal conductivity media (e.g., InP) permits high power handling, the low quantum defect assures low thermal load, and the quantum well active medium is photopumped through transparent heat sinks.

Figure 9:
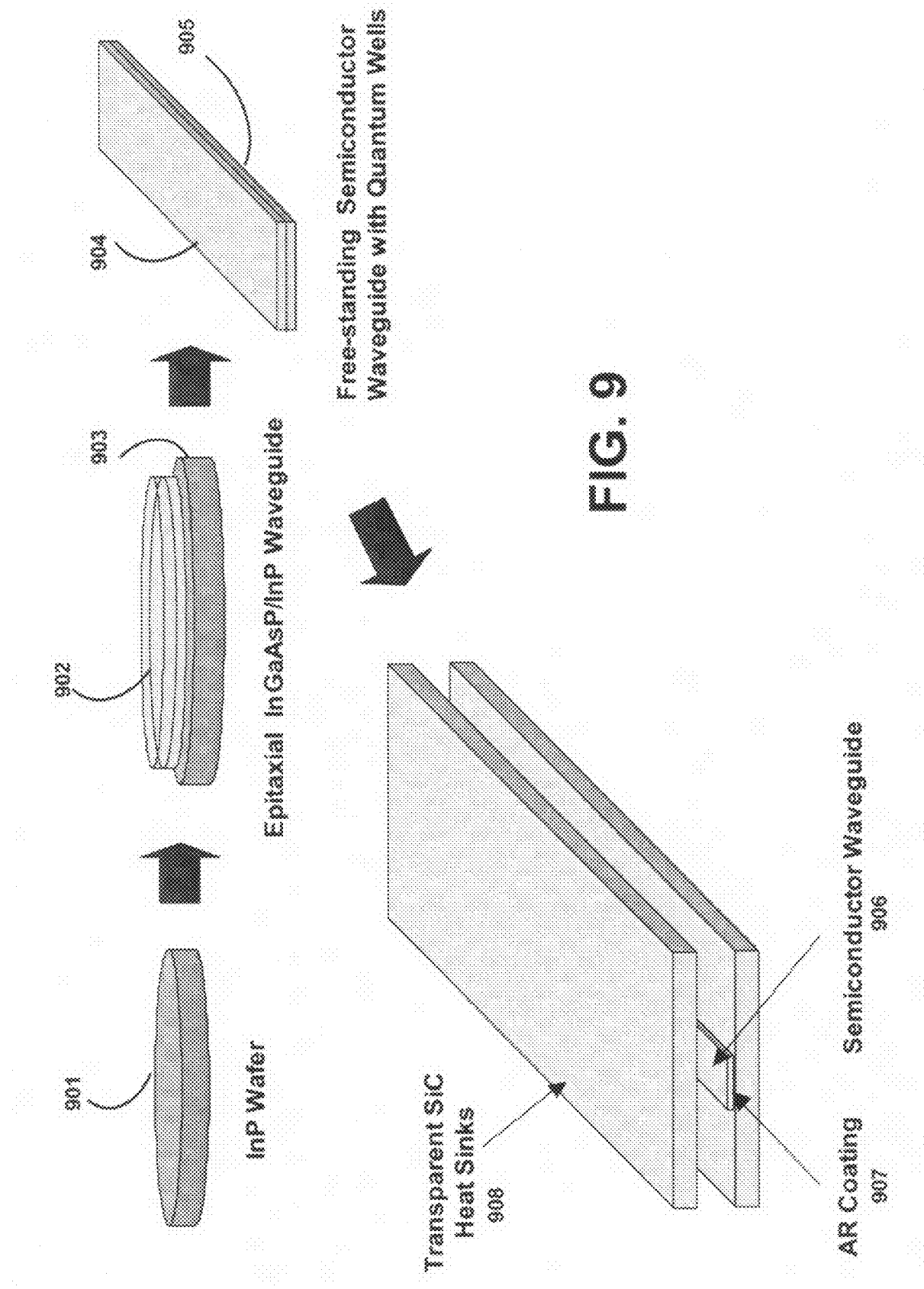
FIG. 9 depicts a semiconductor waveguide fabrication process according to the present method and apparatus.

FIG. 9 depicts a semiconductor waveguide fabrication process according to the present method and apparatus. Fabrication and processing may be performed entirely with an InP or other semiconductor wafer 901. Epitaxial layers 902 may be grown on 3 or 4 inch substrates 903. Free-standing semiconductor waveguide 904 may have quantum wells 905 and may use quaternary alloys to control band gap and lattice constant. Also depicted is the waveguide 906, AR coating 907 and wafer bonded to SiC heat sinks 908.

Figure 10:
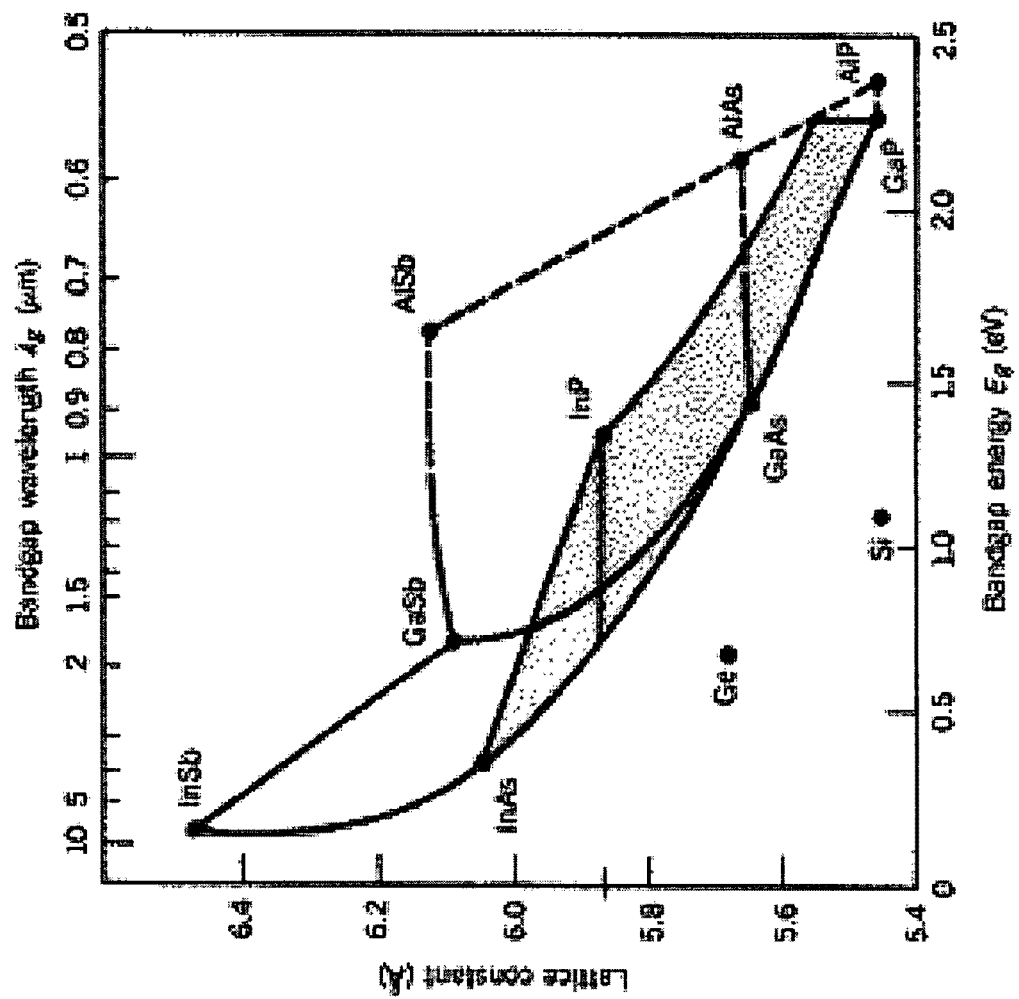
FIG. 10 is a graph depicting lattice constant versus band gap energy.
Figure 11:
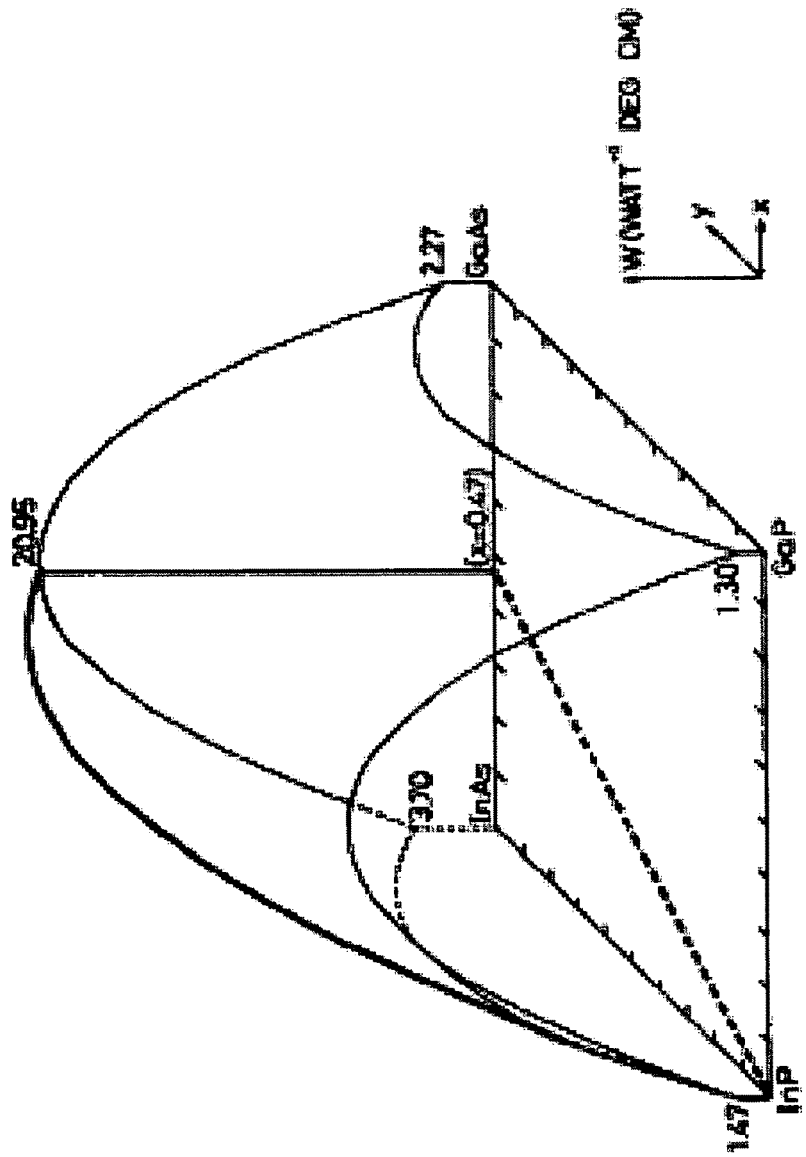
FIG. 11 is a three dimensional representation of the thermal resistivity for $In_{1-x}, Ga_x, As_y, P_{1-y}$ quarternary alloy over the entire range of compositions.

The transparent heat sinks may be attached to the waveguide by using a number of low absorption optical cements. For example, the optical cements or bonding agents may be Norland 61, 65 or 71, with Norland 65 being the most compliant for thermal cycling. FIG. 10 is a graph depicting lattice constant versus band gap energy. Quantum wells may have both band gap and lattice constant mutually controlled. Quaternary III-V alloys (e.g. GaInAsSb, etc.) may be used. The quantum well thickness also modifies wavelength. FIG. 11 is a three dimensional representation of the thermal resistivity for $In_{1-x}$, $Ga_x$, $As_y$, $P_{1-y}$ quaternary alloy over the entire range of compositions. Thus, the quantum well amplifier may function with high heat dissipation.

Figure 12:
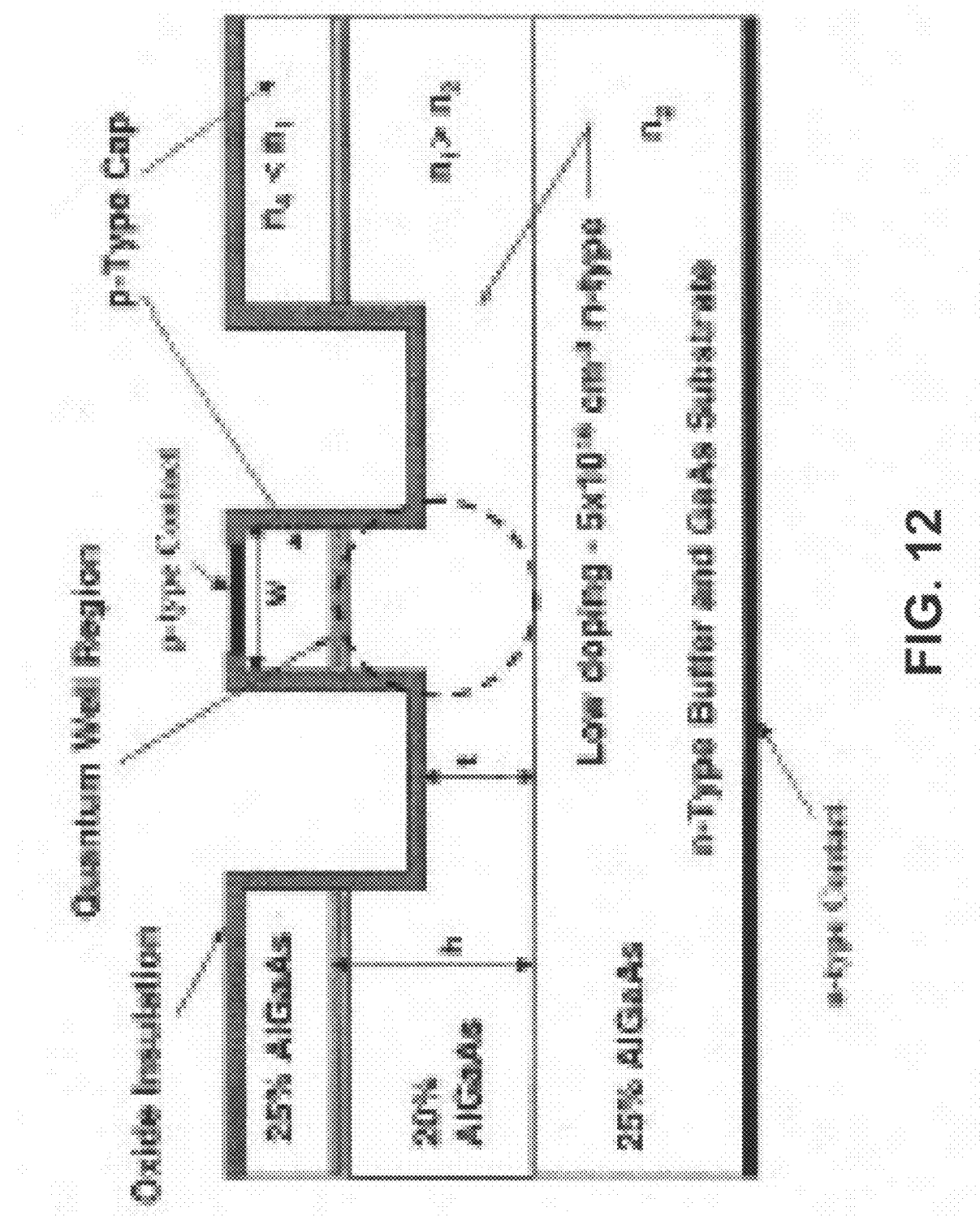
FIG. 12 depicts a MIT-LL SCOWL structure.

FIG. 12 depicts a MASS. INSTITUTE OF TECHNOLOGY LINCOLN LABS SCOWL structure. The present method resembles a high order multimode implementation of SCOWL without electrical pumping. Photopumping enables large waveguide dimensions and may eliminate free carrier loss. Self-imaging design may result in diffraction limited performance with large multimode waveguide.

Figure 13:
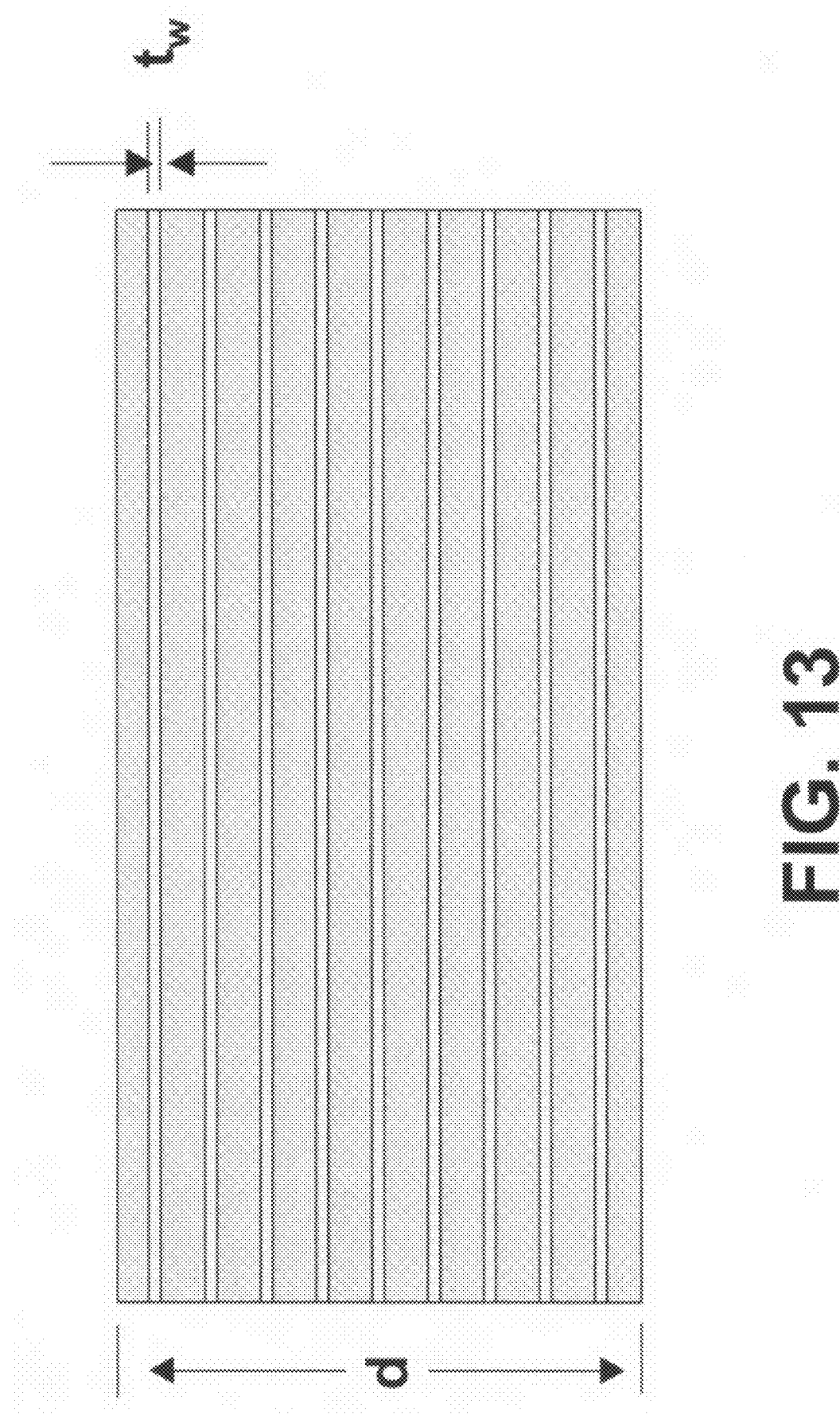
FIG. 13 an example of one embodiment of the principal of operation.
Figure 14:
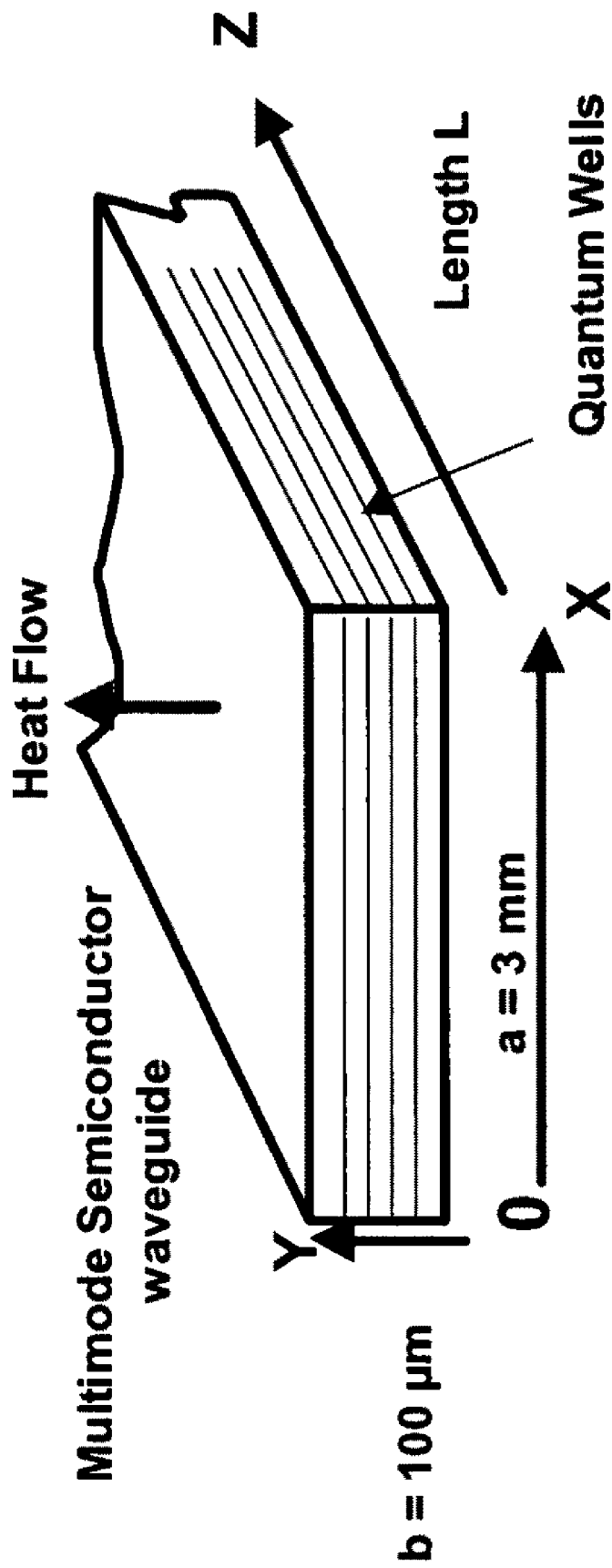
FIG. 14 depicts one example of a semiconductor waveguide amplifier model.

FIG. 13 shows an example of one embodiment of the principal of operation. For an amplifier of thickness d with N quantum wells of thickness $t_w$, an overlap factor T may be calculated as $T=Nt_w/d$. The net gain ($G=\exp(gTL)$) depends on the gain coefficient g for each well and the length L of the amplifier. Quantum well gain may depend on carrier density in a complex way, but can be large (e.g., 100-1000 $cm^{-1}$). Carrier density may also depend on pump intensity and amplifier power in a complex way. FIG. 14 depicts one example of a semiconductor waveguide amplifier model. Features may be a large area semiconductor waveguide, high index contrast, and high order multimode. Waveguide modes (ignoring quantum wells) may be:

$$\phi_{ij} = \sqrt{\frac{4Z}{ab}} \operatorname{Sin}\left(\frac{i\pi x}{a}\right)\operatorname{Sin}\left(\frac{j\pi y}{b}\right),$$

$0 < x < a$ and $0 < y < b$ $i, j = 1, 2, 3, \ldots n$ Eigen function normalized to unit power Signal along length L of amplifier may be calculated as function of pumping and input field distribution to determine gain and efficiency. The heat flow within the waveguide may be determined to obtain total heat load. Heat generated in quantum wells and waveguide may be dissipated by the heat sinks. Amplifier may be designed for Talbot self-imaging length (i.e., $L=4nd^2/\lambda$).

Therefore, a scalable semiconductor photopumped waveguide amplifier may achieve high power and efficiency. VCSEL, SCOWL and waveguide Nd:YAG have demonstrated basic principles. The thermal operating limits may be 5-10 kW. Self-imaging assures diffraction limited output. Embodiments have high coupling efficiency with side pumping. O-O efficiency depends on waveguide loss, and may be 80-90%. Pump spectrum is not that critical and thus, multi-spectrum pump sources, such as flash lamps, might be used. The wavelength of operation may be adjusted by design and material composition. Lattice matching to binary semiconductors assures good thermal properties, and cryocooling may be required for operation at Mid-IR or Long-IR wavelengths.

The present method and apparatus are not limited to the particular details of the depicted embodiments and other modifications and applications are contemplated. Certain other changes may be made in the above-described embodiments without departing from the true spirit and scope of the present method and apparatus herein involved. It is intended, therefore, that the subject matter in the above depiction shall be interpreted as illustrative and not in a limiting sense.

We claim:

1. An apparatus, comprising:
a photopumped self-imaging multimode waveguide amplifier using a semiconductor gain media and having embedded quantum wells provided along a length of the self-imaging multimode waveguide amplifier; and
a plurality of optical pump arrays arranged along arranged along a face of the self-imaging multimode waveguide, for continually photopumping the quantum wells through the self-imaging multimode waveguide to achieve a pumped apparatus with an average power value in the range of five to ten kW, for continually photopumping the quantum wells through at least one substantially transparent heat sink, the heat sink disposed between the pump arrays and the waveguide, thereby avoiding electrical injection.

2. The apparatus according to claim 1, wherein the apparatus further comprises a microchannel cooler that extends substantially the width of the self-imaging semiconductor waveguide, wherein the pump arrays are arranged along the opposed side of the waveguide from the microchannel cooler.

3. The apparatus according to claim 1, wherein the apparatus further comprises first and second heat sinks that extend substantially the width of the self-imaging semiconductor waveguide, and a first plurality of pump arrays arranged along the first heat sink and a second plurality of pump arrays arranged along the second heat sink.

4. An apparatus, comprising:
a self-imaging semiconductor waveguide, the waveguide selected from the group consisting of clad and non-clad waveguides, having a predetermined length, the self-imaging semiconductor waveguide having first and second opposed sides;
quantum wells disposed within the self-imaging semiconductor waveguide along the length of the self-imaging semiconductor waveguide, the quantum wells being formed of a quantum well gain material;
microchannel cooler that extends substantially the width of the self-imaging semiconductor waveguide, the microchannel cooler located adjacent the first side of the self-imaging semiconductor waveguide; and
a plurality of pump arrays arranged along the microchannel cooler opposed from the first side of the self-imaging semiconductor waveguide;
wherein the quantum well gain material is continually photopumped by the pump arrays through a transparent heat sink disposed between the waveguide and the microchannel cooler, thereby avoiding electrical injection.

5. The apparatus according to claim 4, wherein each of the pump arrays has a respective coupling optics.

6. The apparatus according to claim 4, wherein the microchannel cooler is formed of a copper alloy that is expansion matched to the semiconductor waveguide.

7. The apparatus according to claim 4, wherein the microchannel cooler is formed of a copper alloy that includes molybdenum, tungsten or diamond.

8. The apparatus according to claim 4, wherein the self-imaging semiconductor waveguide is formed of a high thermal conductivity InP media material to permit high power handling.

9. The apparatus according to claim 4, wherein the quantum wells use quaternary alloys to control band gap and lattice constant.

10. The apparatus according to claim 4, wherein the quantum wells have both band gap and lattice constant mutually controlled using quaternary alloys.

11. The apparatus according to claim 4, wherein a thickness of the quantum wells modifies a wavelength of the semiconductor waveguide.

* * * * *